(12) United States Patent
Kitahara et al.

(10) Patent No.: US 6,241,007 B1
(45) Date of Patent: Jun. 5, 2001

(54) ELECTRONIC APPARATUS WITH A FLAT COOLING UNIT FOR COOLING HEAT-GENERATING COMPONENTS

(75) Inventors: Chihei Kitahara; Kazuya Shibasaki; Hiroshi Nakamura; Hiroshi Ubukata, all of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/337,742

(22) Filed: Jun. 22, 1999

(30) Foreign Application Priority Data

Jun. 23, 1998 (JP) .................................. 10-175968

(51) Int. Cl.$^7$ ...................................... F28F 7/00
(52) U.S. Cl. .................. 165/80.4; 165/185; 361/688; 361/689; 361/695; 361/700; 257/714; 174/15.2
(58) Field of Search ................. 165/80.3, 80.4, 165/104.33; 361/688, 689, 690, 694, 695, 699, 700, 704; 257/714, 715; 174/15.1, 15.2

(56) References Cited

U.S. PATENT DOCUMENTS

| 5,513,070 | 4/1996 | Xie et al. . |
| 5,568,360 | 10/1996 | Penniman et al. . |
| 5,598,320 | 1/1997 | Toedtman et al. . |
| 5,764,482 | 6/1998 | Meyer, IV et al. . |
| 6,049,455 | * 4/2000 | Nakamura et al. ............... 165/80.3 |

FOREIGN PATENT DOCUMENTS

| 9-27690 | 1/1997 | (JP) . |
| 9-233406 | 9/1997 | (JP) . |
| 10-51170 | 2/1998 | (JP) . |

* cited by examiner

Primary Examiner—Ira S. Lazarus
Assistant Examiner—Terrell McKinnon
(74) Attorney, Agent, or Firm—Finnegan, Henderson, Farabow, Garrett & Dunner, L.L.P.

(57) ABSTRACT

An electronic apparatus having a housing, a heat-generating component provided in the housing, and a heat sink for cooling the heat-generating component. The heat sink has two metal plates. The first metal plate has a heat receiving portion thermally connected to the heat-generating component. The second metal plate is laid on the first metal plate and thermally connected thereto.

9 Claims, 12 Drawing Sheets

ELECTRONIC APPARATUS WITH A FLAT COOLING UNIT FOR COOLING HEAT-GENERATING COMPONENTS

RELATED APPLICATIONS

This application claims priority to Japanese Application No. 10-175968, filed Jun. 23, 1998.

BACKGROUND OF THE INVENTION

The present invention relates to an electronic apparatus such as a portable computer, and more particularly to a structure for cooling the heat-generating components provided in such an electronic apparatus.

In recent years, portable electronic apparatuses, represented by book-like portable computers and mobile information apparatuses, have been developed. Each of these apparatuses incorporates a high-speed MPU (Microprocessing Unit) and has various functions in order to process multimedia information, such as characters, speech, sound, and images. The higher the integration density it has, and the more functions it performs, the more electric power the MPU consumes while operating. The more electric power it consumes, the more heat the MPU generates. In the case of a portable computer incorporating an MPU, the heat generated by the MPU must be radiated efficiently from the MPU in the housing of the portable computer. It is therefore absolutely necessary to provide a cooling unit in the housing to cool the MPU positively.

A conventional system for cooling an MPU will be described, with reference to FIG. 25. As shown in FIG. 25, an MPU 2 is mounted on a circuit board 1 provided in the housing (not shown) of a portable computer. A cooling unit 3 for cooling the MPU 2 is provided on the upper surface of the circuit board 1.

The cooling unit 3 comprises a flat heat sink 4 and an electric fan device 5. The heat sink 4 is made of metal having high thermal conductivity, such as aluminum alloy. The heat sink 4 is thermally connected to the MPU 2. Hence, heat can be conducted from the MPU 2 to the heat sink 4. The heat sink 4 has a number of radiation fins 6 on the upper surface, which faces away from the MPU 2. The radiation fins 6 extend in the direction of thickness of the heat sink 4 and are exposed in the housing of the portable computer.

The electric fan device 5 is arranged at one end of the heat sink 4. The device 5 comprises a fan casing 7 and a fan 8. The fan casing 7 has an air passage 7a. The fan 8 is provided in the air passage 7a. The fan device 5 is vertically positioned and secured to the heat sink 4, and the rotation axis O1 of the fan 8 extends horizontally. The inlet end of the air passage 7a faces the radiation fins 6, whereas the outlet end of the passage 7a faces the exhaust port of the housing.

When the fan 8 is driven and rotated, a stream of cooling air is generated in the housing, flowing toward the heat sink 4. The cooling air then flows along the heat sink 4 and the radiation fins 6. Finally, the air is exhausted from the housing through the exhaust port of the housing. The convection of cooling air, occurring in the housing, cools the heat sink 4. Thus, the heat transmitted from the MPU 2 to the heat sink 4 is expelled from the housing.

A prominent commercial value of portable electronic apparatuses, such as portable computers, is their portability. This is why the housings of portable computers are getting thinner and lighter recently, so that they may be put into bags and the like. The above-described cooling unit 3, which incorporated in the housing of the portable computer, should also be made thinner and lighter.

However, the conventional cooling unit 3 can hardly be rendered lighter for the following reason. As mentioned above, the heat sink 4 is cooled by virtue of the convection of cooling air. The cooling ability of the unit 3 is therefore determined by the surface area of the heat sink 4 and the flow rate of the cooling air supplied by the fan device 5. In order to increase the cooling ability, the heat sink 4 must be larger and more radiation fins 6 must be provided. Consequently, the cooling unit 3 must be heavier.

To make matters worse, the conventional cooling unit 3 must be rather thick. This is because the fan device 5 is vertically positioned and secured to the heat sink 4 and the rotation axis O1 of the fan 8 extends horizontally. The fan casing 7 inevitably project upward for a long distance from the heat sinks 4.

As a consequence, the higher the cooling ability of the unit 3, the thicker, larger and heavier the cooling unit 3 should be. Any portable computer that incorporates a thick cooling unit can hardly be as thin as is desired.

BRIEF SUMMARY OF THE INVENTION

The object of the present invention is to provide an electronic apparatus in which a heat-generating component, such as an MPU, can acquire a sufficient cooling ability and whose housing can yet be as thin as is desired.

To attain the object, an electronic apparatus according to the first aspect of the invention comprises: a housing; a heat-generating component provided in the housing; and a heat sink including a first metal plate and a second metal plate, for cooling the heat-generating component. The first metal plate having a heat receiving portion thermally connected to the heat-generating component. The second metal plate being laid on the first metal plate and thermally connected thereto.

When the electronic apparatus is used, the heat-generating component generates heat. The heat is transmitted to the heat receiving portion of the first metal plate. The heat then diffuses into the entire heat sink. The first metal plate is laid on the second metal plate. If the second metal plate has a higher thermal conductivity than the first metal plate, it can efficiently transmit the heat to every part of the first metal plate from the heat receiving portion.

The first metal plate may be thicker to have a larger thermal capacity or a lower thermal resistance in order to achieve efficient conduction of heat by using the first metal plate only. However, the thicker the plate, the thicker and heavier the heat sink. Consequently, the housing may not be as thin as desired.

Nonetheless, the second metal plate transfers the heat from the heat receiving portion with high efficiency. No heat spots are formed in the limited part of the first metal plate. The heat can be efficiently radiated, without necessity of making the first metal plate thicker. As a result, the heat sink can be made thin, and ultimately the housing can be made thin.

Various types of metal plates may be prepared, each different in size and shape or in size, and one type that can best transfer the heat generated by the heat-generating component may then be selected and used as the second metal plate. In this case, heat will be transferred from the heat-generating component to the heat sink, neither too much nor too little.

To accomplish the object described above, an electronic apparatus according to the second aspect of the invention comprises: a housing; a heat-generating component provided in the housing; and a cooling unit for cooling the heat-generating component. The cooling unit comprises a heat sink, a fan device, and a heat pipe. The heat sink has a heat receiving portion thermally connected to the heat-generating component and a heat exchanging portion formed integral with the heat receiving portion. The fan device is arranged at the heat exchanging portion and includes a fan facing the heat exchanging portion, for applying cooling air to the heat exchanging portion, and a fan casing having an air outlet port for expelling the cooling air. The heat pipe transfers heat generated by the heat-generating component, from the heat receiving portion to the heat exchanging portion. The heat pipe has a heat-radiating portion that faces the air outlet port.

When the electronic apparatus is used, the heat-generating component generates heat. The heat is transmitted to the heat receiving portion of the heat sink and hence to the heat exchanging portion and diffuses in the entire heat sink. Part of the heat conducted to the heat receiving portion is positively transferred through the heat pipe to the heat exchanging portion. Thus, the heat is transferred from the heat receiving portion to the heat exchanging portion through various passages, with high efficiency.

When the fan device is rotated, the fan of the fan device applies cooling air directly to the heat exchanging portion. Thus, no thermal resistance exists to prevent transfer of heat between the heat exchanging portion and the fan device. The heat exchanging portion is thereby efficiently cooled with forced convection of the cooling air. As a result, the heat conducted from the heat exchanging portion is released from the heat sink as the cooling air flows.

Moreover, the heat radiating portion is directly cooled with the cooling air, because the air is applied from the air outlet port of the fan device to the heat radiating portion of the heat pipe. The operating medium in the heat pipe is efficiently condensed. This promotes the transfer of heat from the heat receiving portion to the heat exchanging portion. The heat generated by the heat-generating component can concentrate in the heat exchanging portion of the heat sink and can be efficiently released into the atmosphere. The heat sink has no radiation fins and can yet have high cooling efficiency. It can therefore be made thin and compact.

The fan device assumes a horizontal position, extending along the heat exchanging portion. It does not extend a long distance in the direction of thickness of the heat sink. Hence, the heat sink is thin, and cooling unit is thin enough to be incorporated in the flat housing.

To achieve the object described above, an electronic apparatus according to the third aspect of this invention comprises: a housing; a heat-generating component provided in the housing; a heat sink provided in the housing, for cooling the heat-generating component, said heat sink having a first metal plate and a second metal plate, said first metal plate having a heat receiving portion thermally connected to the heat-generating component and a heat exchanging portion formed integral with the heat receiving portion, and said second metal plate being laid on the first metal plate and thermally connecting the heat receiving portion and the heat exchanging portion and having a higher thermal conductivity than the first metal plate; a fan device arranged at the heat exchanging portion and including a fan facing the heat exchanging portion, for applying cooling air to the heat exchanging portion; and a heat pipe supported by the second metal plate, for transferring heat generated by the heat-generating component, from the heat receiving portion to the heat exchanging portion.

When the electronic apparatus is used, the heat-generating component generates heat. The heat is transmitted to the heat receiving portion of the first metal plate and hence to the heat exchanging portion thereof. Thus, the heat diffuses in the entire first metal plate. The heat is transmitted from the first metal plate to the second metal plate, because the second metal is laid on the first metal plate. The second metal plate has a higher thermal conductivity than the first metal plate. Hence, the second metal plate efficiently conducts the heat generated by the heat-generating component, to the heat exchanging portion.

In addition, part of the heat conducted from the heat-generating component to the heat receiving portion is positively transferred through the heat pipe to the heat exchanging portion. Thus, the heat is transferred from the heat receiving portion to the heat exchanging portion through various passages, with high efficiency. As a result, no heat spots are formed near the heat receiving portion of the heat sink. The heat can be efficiently radiated, without necessity of making the heat sink thicker.

Various types of metal plates may be prepared, each different in size and shape or in size, and one type that can best transfer the heat generated by the heat-generating component may then be selected and used as the second metal plate. In this case, heat will be transferred from the heat-generating component to the heat sink, neither too much nor too little.

The second metal plate supports the heat pipe. In view of this, various types of metal plates may be prepared, each different in size and shape or in size, and various types of heat pipes may be prepared, each different in diameter and shape. One type of a metal plate and one type of a heat pipe, that can best transfer the heat generated by the heat-generating component, may then be selected and used as the second metal plate and the heat pipe, respectively. In this case, the second metal plate and the heat pipe will transferred heat from the heat-generating component at the same rate the component generates heat.

When the fan device is rotated, the fan of the fan device applies cooling air directly to the heat exchanging portion. Thus, no thermal resistance exists to prevent transfer of heat between the heat exchanging portion and the fan device. The heat exchanging portion is thereby efficiently cooled with forced convection of the cooling air. As a result, the heat sink can have a sufficiently high cooling efficiency, without radiation fins. Having no radiation fins, the heat sink is thin and compact.

The fan device takes a horizontal position, extending along the heat exchanging portion. It does not extend a long distance in the direction of thickness of the heat sink. Hence, the heat sink is thin enough to be incorporated in the flat housing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A portable computer, which is the first embodiment of this invention, will be described, with reference to FIGS. 1 to 13.

Figure 1:
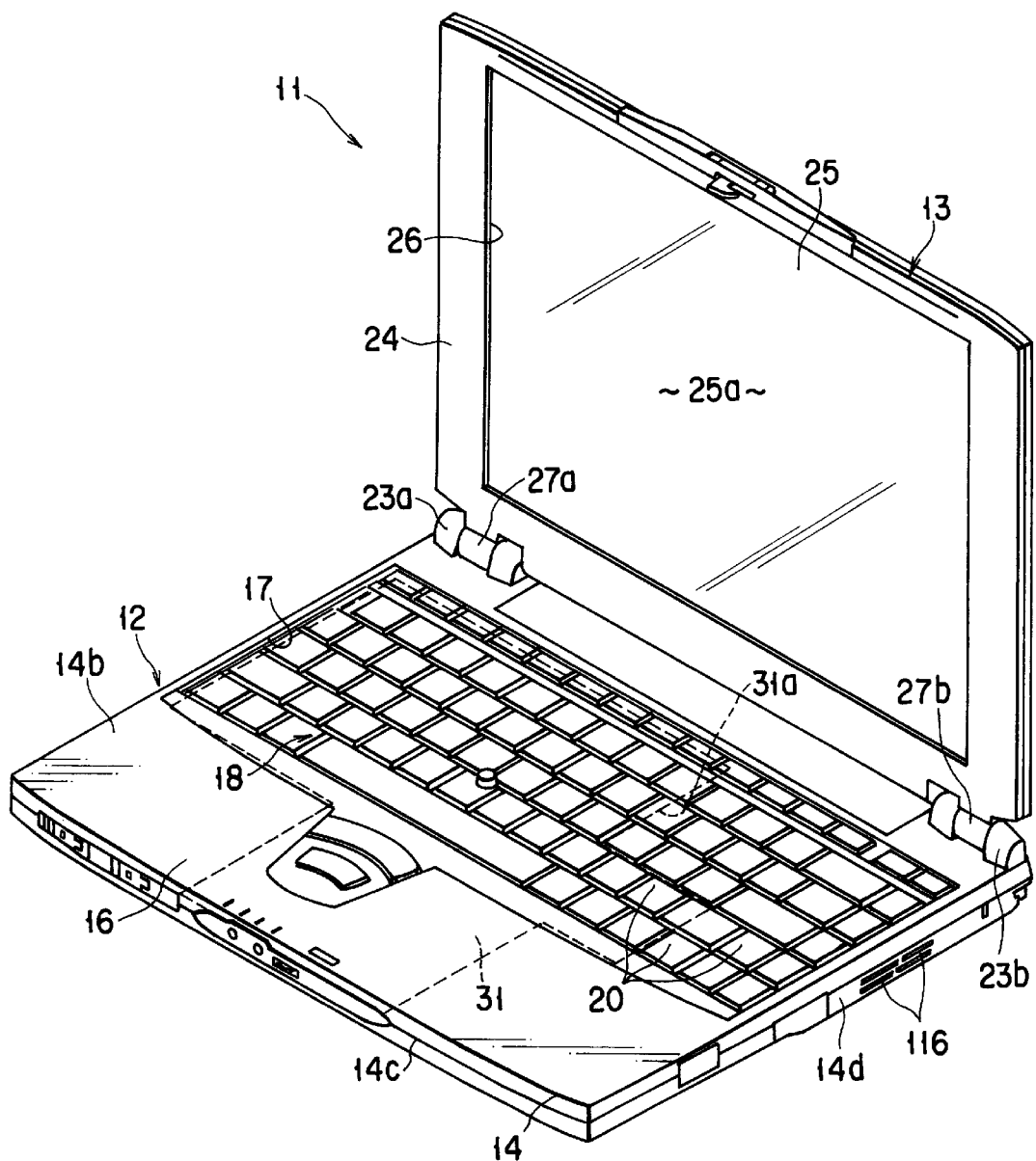
FIG. 1 is a perspective view of a portable computer according to the first embodiment of the present invention.
Figure 2:
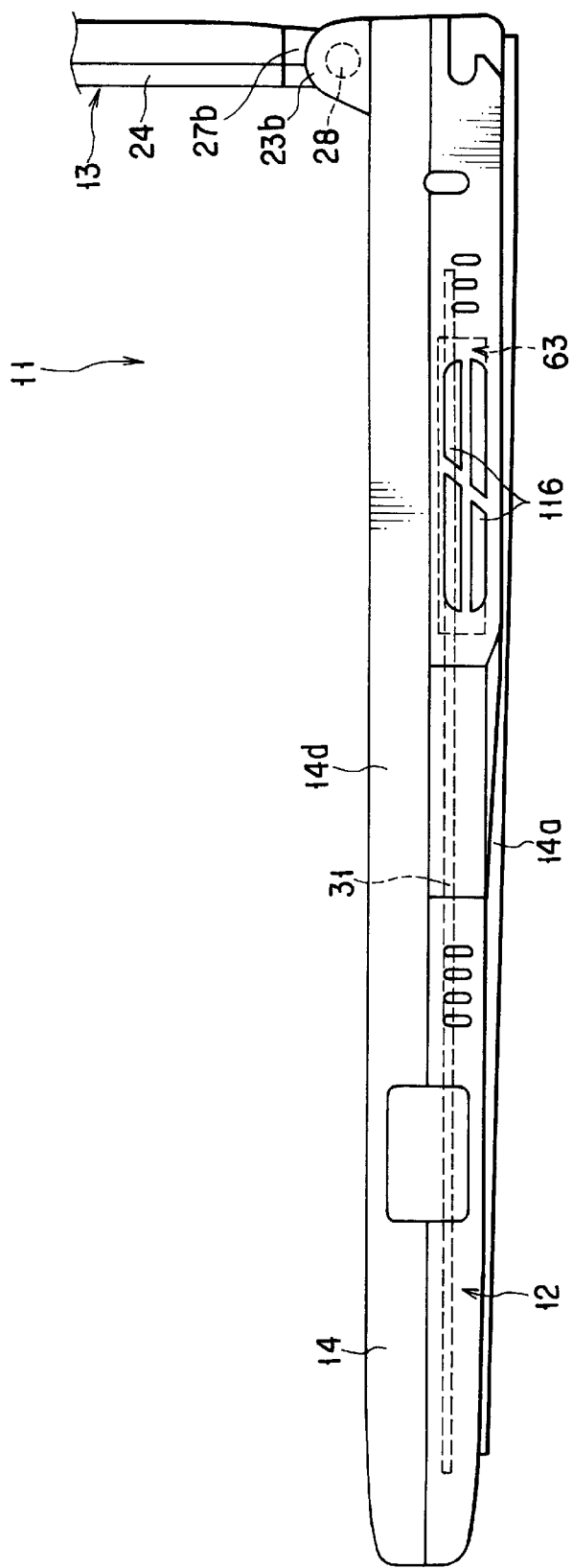
FIG. 2 is a side view of the portable computer shown in FIG. 1.

FIG. 1 shows the book-like portable computer 11, or an electronic apparatus according to the present invention. The portable computer 11 comprises a main body 12 and a display unit 13 supported by the main body 12.

The man body 12 has a box-shaped housing 14. The housing 14 is made of metal having high thermal conductivity, such as magnesium alloy. The housing 14 comprises a bottom wall 14a, a top wall 14b, a front wall 14c, left and right side walls 14d, and a rear wall (not shown). The top wall 14b opposes the bottom wall 14a. The front wall 14c, side walls 14d and rear wall connect the bottom wall 14a and top wall 14b. The housing 14 is about 20 mm thick, being thinner than the housings of most conventional portable computers.

The top wall 14b of the housing 14 has a palm rest 16 and a keyboard recess 17. The palm rest 16 is located at the front part of the top wall 14b. The palm rest 16 is rectangular, extending in the widthwise direction of the housing 14. The keyboard recess 17 is located at the back of the palm rest 16. The recess 17 has an opening, which communicates with the interior of the housing 14.

Figure 3:
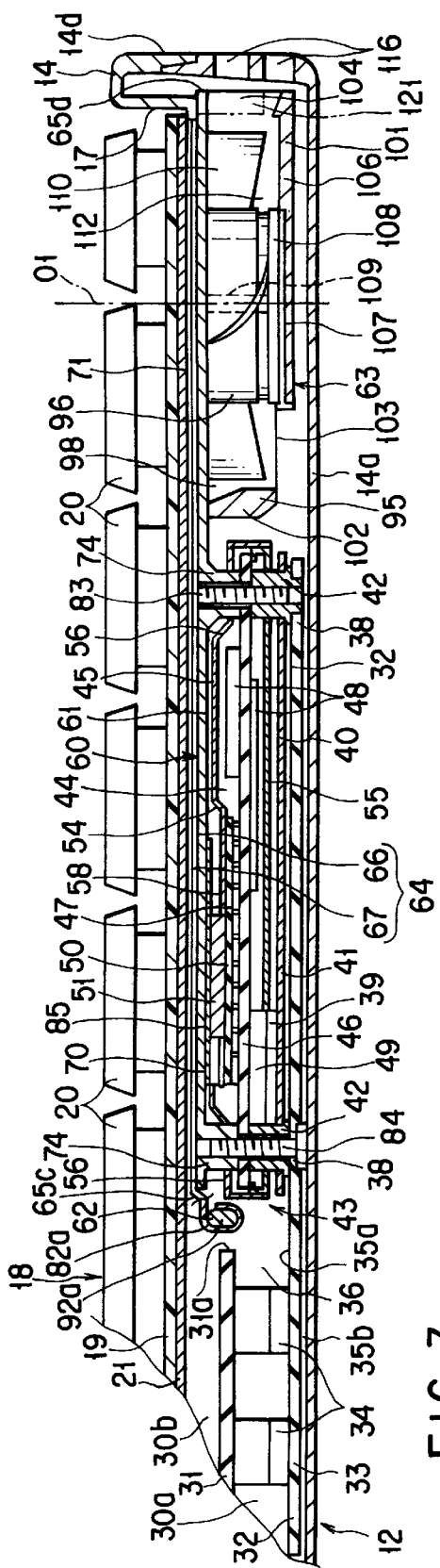
FIG. 3 is a sectional view of the portable computer, showing the positional relation of the MPU and the cooling unit.

A keyboard 18 is fitted in the keyboard recess 17. As shown in FIG. 3, the keyboard 18 comprises a keyboard base 19, a number of keys 20, and a reinforcing plate 21 made of metal. The keyboard base 19 is a rectangular plate, which is fitted in the recess 17 with no gaps between it and the recess 17. The keys 20 are arranged on the upper surface of the keyboard base 19. The reinforcing plate 21 is mounted on the lower surface of the keyboard base 19. The plate 21 is exposed to the interior of the housing 14, through the opening of the keyboard recess 17.

As shown in FIG. 1, a pair of display supports 23a and 23b are provided on the top wall 14b of the housing 14. The display supports 23a and 23b are located at the rear part of the top wall 14b. The supports 23a and 23b are spaced from each other in the widthwise direction of the housing 14.

The display unit 13 comprises a box-like display housing 24 and a liquid-crystal display module 25. The display housing 24 has a front wall, which has a rectangular opening 26. The display module 25 is a flat component set in the display housing 24. The display module 25 has a screen 25a for displaying characters and images. The screen 25a is exposed through the rectangular opening 26 made in the front wall of the display housing 24.

The display housing 24 has a pair of legs 27a and 27b. The legs 27a and 27b protrude downwards from the lower edge of the housing 24. The legs 27a and 27b are hinged to the display supports 23a and 23b, respectively, by means of hinge devices 28 (shown in FIG. 2). The display unit 13 is thereby connected to the housing 14 and can be rotated. More specifically, the unit 13 can be rotated between a closed position and an opened position. In the closed position, the display unit 13 covers the palm rest 16 and keyboard 18. In the opened position, the display unit 13 opens the palm rest 16, keyboard 18 and display screen 25a.

As shown in FIG. 3, a first circuit board 31, or a system board, is provided in the housing 14. The first circuit board 31 is located below the palm rest 16 and keyboard 18 and extends parallel to the bottom wall 14a of the housing 14. A space 30a is provided between the bottom wall 14a of the housing 14 and the lower surface of the first circuit board 31. Similarly, a space 30b is provided between the keyboard 18 and the upper surface of the first circuit keyboard 31. The spaces 30a and 30b accommodate the circuit parts (not shown) that are mounted on the first circuit board 31.

As FIG. 1 shows, the first circuit board 31 has a notch 31a. The notch 31a is cut in the corner defined by the right and rear edge of the first circuit board 31. The notch 31a is located below the right-end part of the keyboard 18.

Referring again to FIG. 3, a second circuit board 32, or a relay board, is provided in the housing 14. The second circuit board 32 is located below the notch 31a of the first circuit board 31 and extends along the bottom wall 14a of the housing 14. The second circuit board 32 is positioned below the first circuit board 31. Namely, the circuit boards 31 and 32 are spaced in the direction of thickness of the housing 14. Hence, a space 36 exists between the second circuit board 32 and the right-end part of the keyboard 18.

The second circuit board 32 has an extension 33, which extends below the first circuit board 31. A pair of stacking connectors 34 electrically connects the extension 33 to the first circuit board 31.

Figure 9:
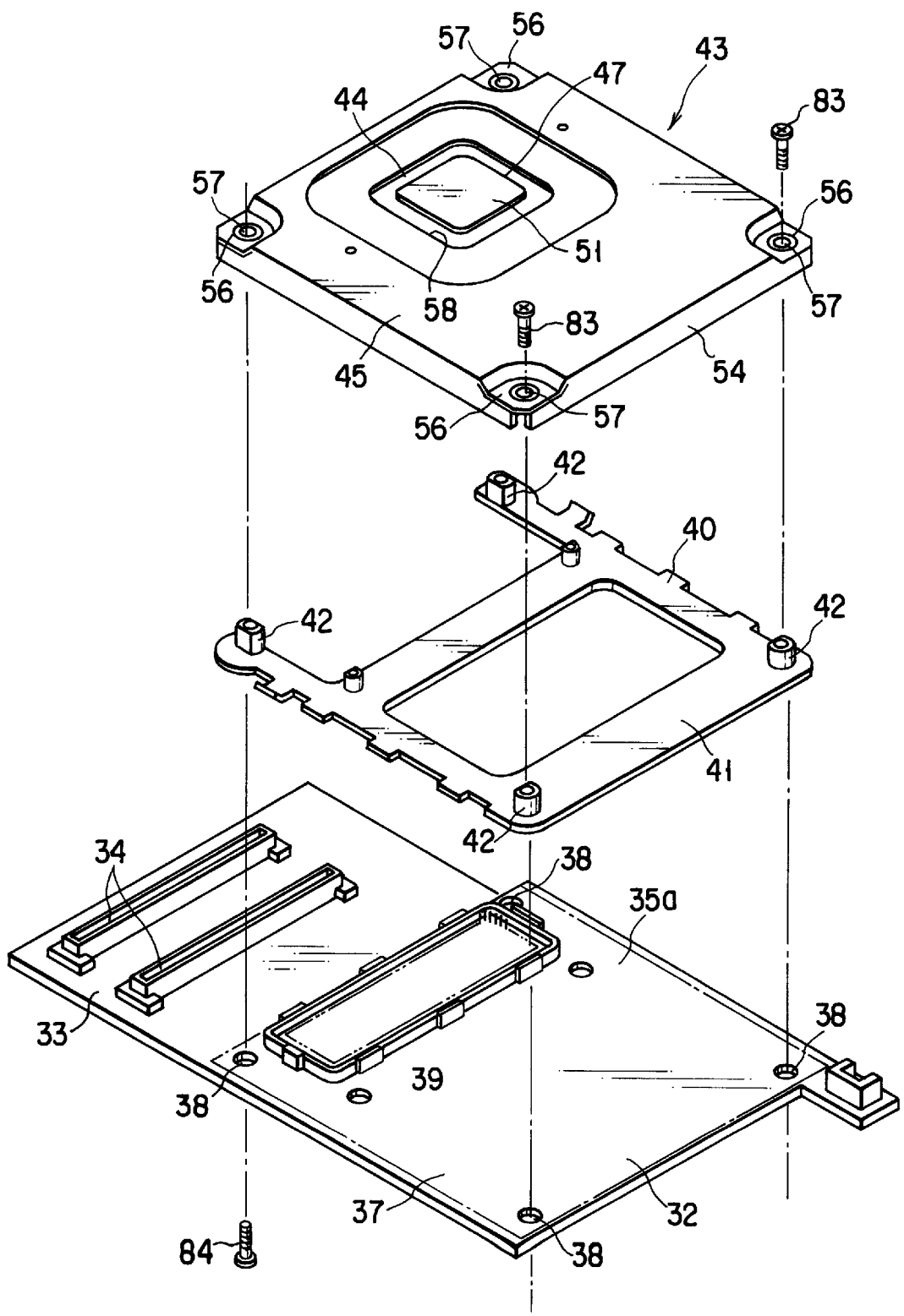
FIG. 9 is an exploded view showing the second circuit board and the MPU, both incorporated in the portable computer.

The second circuit board 32 has an upper surface 35a and a lower surface 35b. The lower surface 35b opposes the bottom wall 14a of the housing 14. As shown in FIG. 9, the upper surface 35a has a rectangular MPU-mounting region 37. The region 37 is exposed to the above-mentioned space 36 in the housing 14. Four through holes 38 are made in the MPU-mounting region 37. The holes 38 are located at the four corners of the region 37, respectively.

A first connector 39 and an MPU holder 40 are arranged in the MPU-mounting region 37. The first connector 39 is electrically connected to the second circuit board 32. The MPU holder 40 comprises a metal frame 41 and four bosses 42. The bosses 42 are secured to the metal frame 41. The metal frame 41 is a flat plate and laid on the upper surface 35a of the second circuit board 32. The bosses 42 are axially aligned with the through holes 38 made in the second circuit board 32. The bosses 42 project upwards from the metal frame 41 and are located above the MPU-mounting region 37 of the second circuit board 32.

As shown in FIGS. 3 and 9, the MPU holder 40 supports an MPU (Microprocessing Unit) 43. The MPU 43 comprises a multi-chip module 44 (hereinafter referred to as "MCM 44") and a flat case 45 holding the MCM 44.

As is best illustrated in FIG. 3, the MCM 44 comprises a multi-layered wiring substrate 46, a BGA-type semiconductor package 47, a plurality of QFP-type semiconductor packages 48, and a second connector 49. The BGA-type package 47 is mounted on the upper surface of the wiring substrate 46. Some of the QFP-type packages 48 are mounted on the upper surface of the wiring substrate 46. The other QFP-packages 48 are mounted on the lower surface of the wiring substrate 46. The second connector 49 is mounted on the lower surface of the wiring substrate 46.

The BGA-type semiconductor package 47 comprises a base 50 and an IC chip 51. The base 50 is mounted on the upper surface of the wiring substrate 46. The IC chip 51 is connected to the base 50 by solder balls, in the form of a flip chip. The IC chip 51 consumes much power while operating to process useful multimedia information such as characters, speech, sound and images. The chip 51 therefore generates much heat while operating and needs to be cooled to keep normally operating.

The case 45, which is shown in FIGS. 3 and 9, is made of metal having high thermal conductivity, such as aluminum alloy. The case 45 comprises a main body 54 and a cover 55. The cover 55 closes the opening of the main body 54. The main body 54 covers the upper surface of the wiring substrate 46 and the semiconductor packages 47 and 48. The main body 54 has four corners, in which four recesses 56 are made. The recesses 56 are vertically aligned with the bosses 42 of the MPU holder 40. Each recess 56 has a through hole 57. The bottom of each recess 56 is at a level a little higher than the upper surface of the wiring substrate 46. The cover 55 is removably latched to the main body 54. The cover 55 covers the lower surface of the wiring substrate 46 and the semiconductor packages 48 mounted on the lower surface of the substrate 46. The cover 55 cooperates with the recesses 56, clamping the wiring substrate 46. The substrate 46 is thereby secured to the case 45.

As is depicted in FIG. 3, the cover 55 overlaps the MPU holder 40. The bosses 42 of the MPU holder 40 are inserted into the case 45 through the cover 55. The tips of the bosses 42 contact the lower surface of the wiring substrate 46.

The second connector 49, which is mounted on the lower surface of the wiring substrate 46, extends through the cover 55 and is exposed outside the case 45. The second connector 49 is fitted to the first connector 39. The MPU 43 and the second circuit board 32 are electrically connected.

Figure 11:
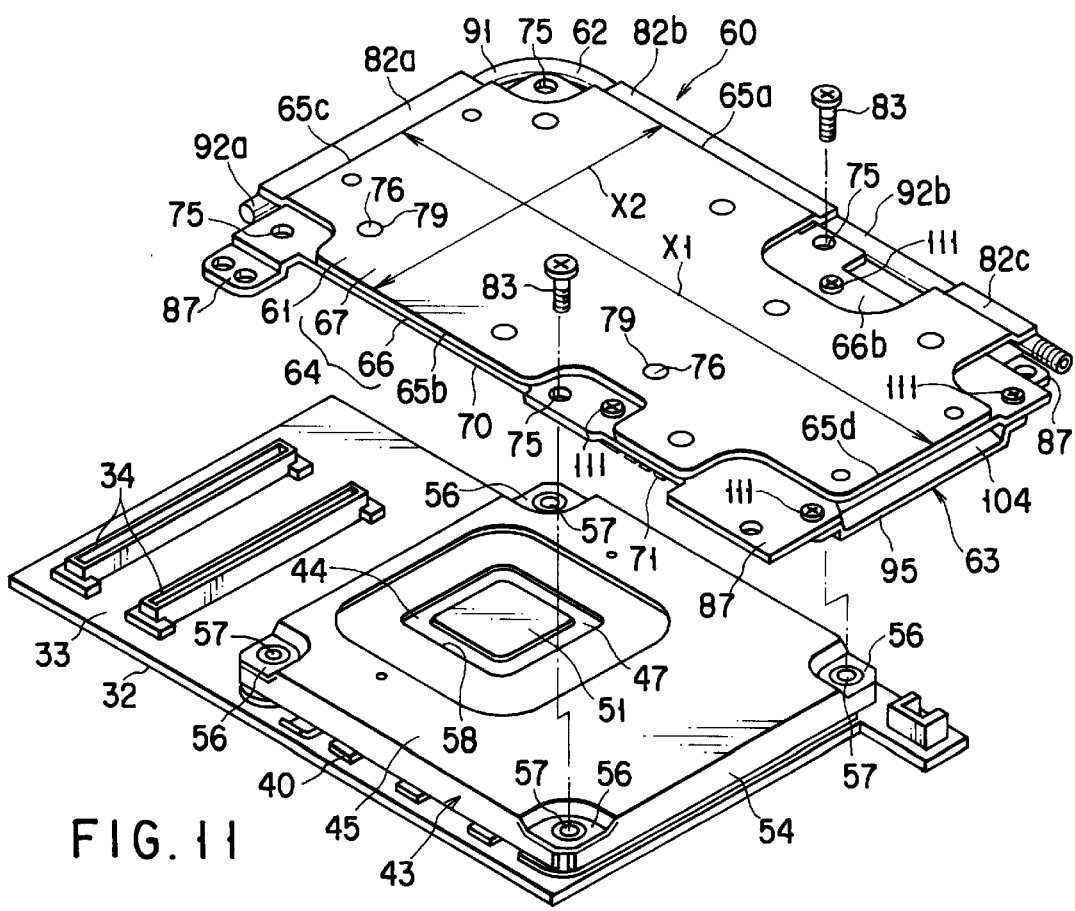
FIG. 11 is an exploded perspective view depicting the MPU mounted on the second circuit board, and the cooling unit.

As shown in FIGS. 9 and 11, the main body 54 of the case 45 has an opening 58. The opening is rectangular and larger than the IC chip 51. The IC chip 51 is exposed through the opening 58.

Figure 10:
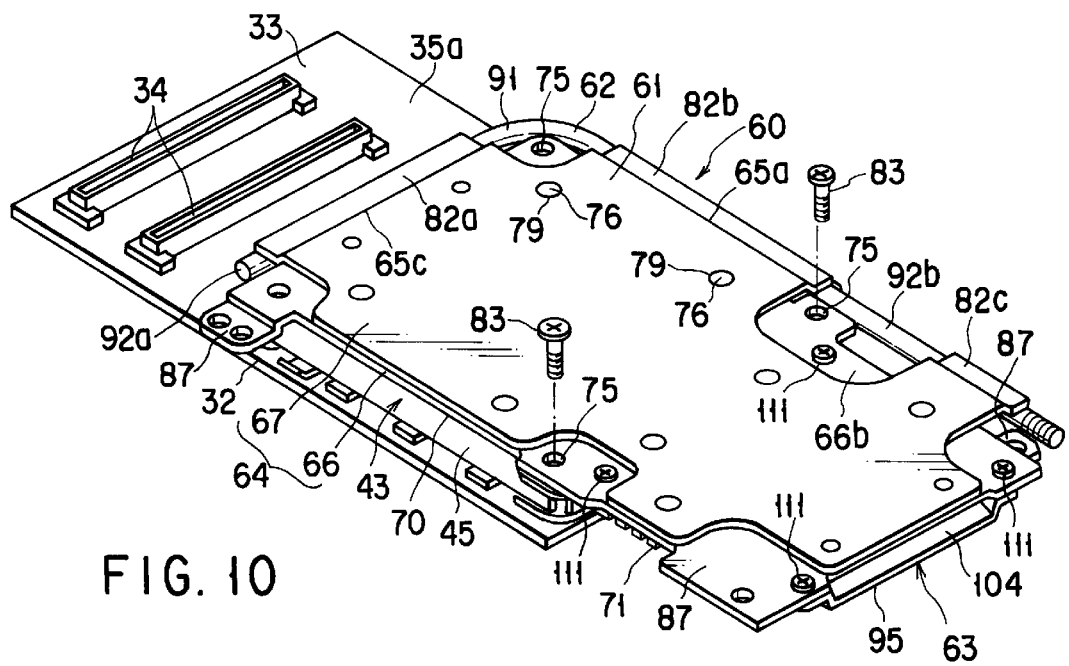
FIG. 10 is a perspective view of the cooling unit to which the MPU is thermally connected.

As illustrated in FIGS. 3, 10 and 11, a cooling unit 60 is provided in the space 36 in the housing 14. The unit 60 is designed to cool the IC chip 51. The cooling unit 60 is located above the MPU-mounting region 37 of the second circuit board 32. The cooling unit 60 comprises a heat sink 61, a heat pipe 62, and an electric fan device 63.

Figure 5:
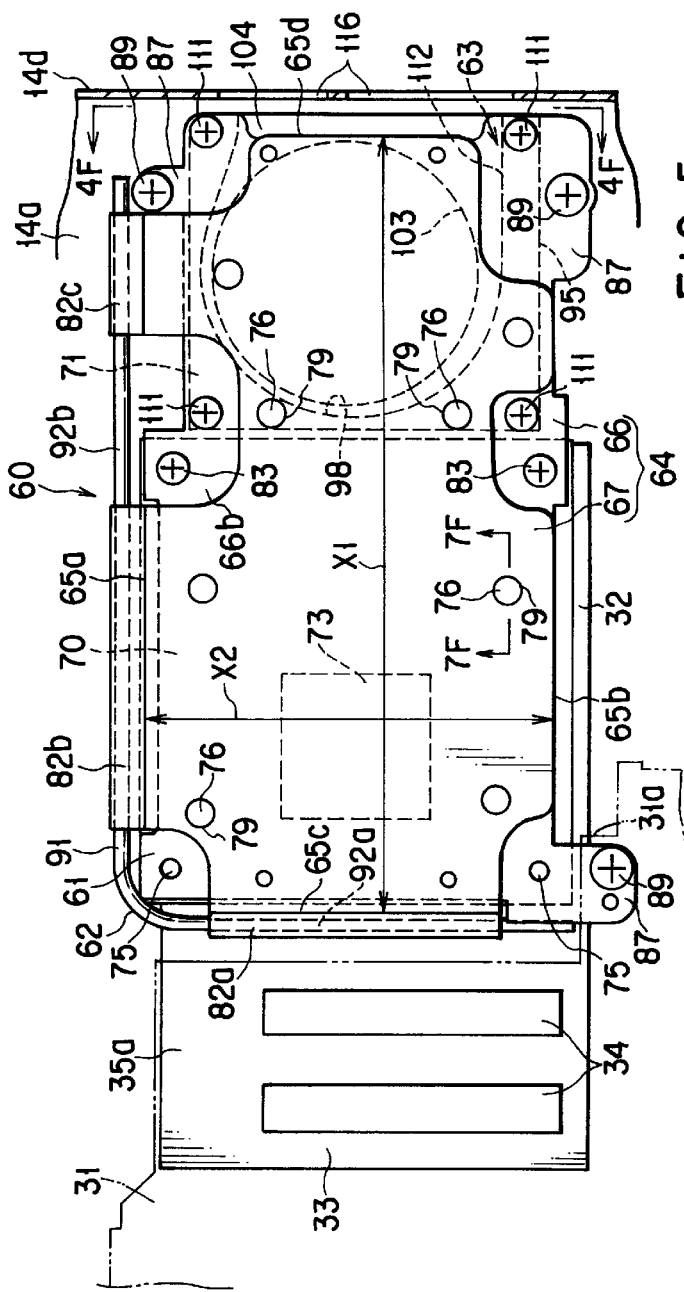
FIG. 5 is a plan view, depicting the cooling unit incorporated in the housing of the portable computer.

The heat sink 61 has a flat rectangular radiation panel 64. As shown in FIG. 5, the radiation panel 64 has a long axis X1 and a short axis X2. The long axis X1 extends in the widthwise direction of the housing 14. The short axis X2 extends in the depthwise direction of the housing 14. The radiation panel 64 has four edges 65a to 65d. The first and second edges 65a and 65b extend along the long axis X1. The third and fourth edges 65c and 65d extend along the short axis X2.

Figure 6:
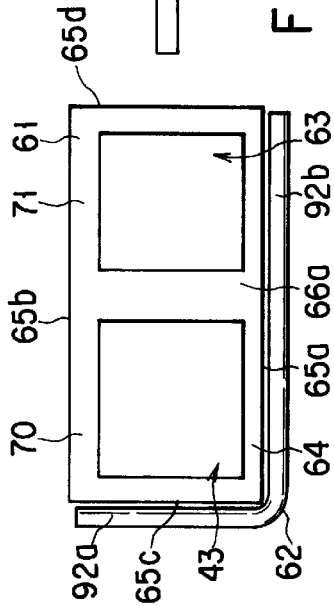
FIG. 6 is a sectional view showing a projection of the first metal plate, fitted in a hole made in the second metal plate.

The radiation panel 64 comprises a first metal plate 66 and a second metal plate 67, which are laid one upon the other. The first metal plate 66 is a diecast molding of aluminum alloy, having a high-precision size. The first metal plate 66 has a thermal conductivity $\alpha 1$. The first metal plate 66 has a lower surface 66a and an upper surface 66b, both being smooth. As shown in FIG. 6, a plurality of projections 76 are provided on the upper surface 66b of the first metal plate 66. The projections 76 are distributed over a large area on the upper surface 66b.

Figure 7:
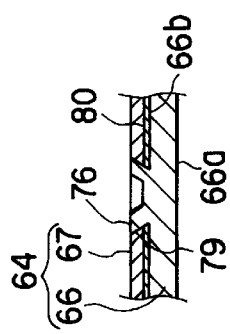
FIG. 7 is a sectional view taken along line 7F—7F in FIG. 5.

The second metal plate 67 is made of copper and has a specific thermal conductivity $\alpha 2$. The thermal conductivity $\alpha 2$ is larger than the thermal conductivity $\alpha 1$ of the first metal plate 66. The second metal plate 67 is laid on the upper surface of the first metal plate 66. As shown in FIGS. 5 and 6, the second metal plate 67 has a plurality of holes 79. The projections 76 of the first metal plate 66 are fitted in the holes 79. As shown in FIG. 7, the tips of the projections 76 are caulked. The metal plates 66 and 67 are thereby fastened together, forming the radiation panel 64.

Thermally conductive grease 80 is applied in the gap between the first metal plate 66 and the second metal plate 67. Hence, no gap that may impair heat conduction exists between the metal plates 66 and 67. As a result, the thermal resistance at the interface between the metal plates 66 and 67 is minimized.

Figure 12:
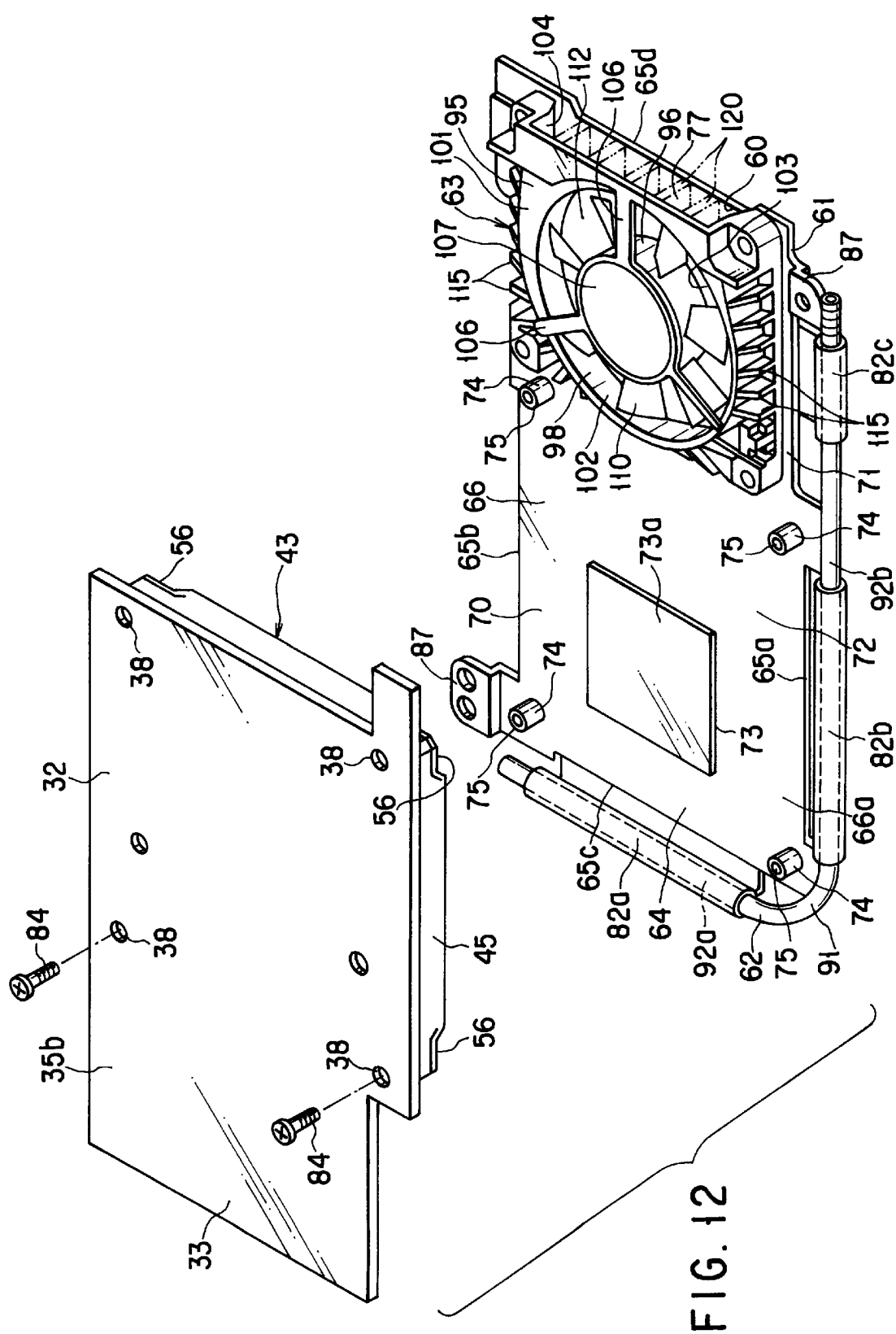
FIG. 12 is another exploded view illustrating the MPU mounted on the second circuit board, and the cooling unit.

FIG. 12 shows the radiation panel 64 as viewed from below, showing the lower surface 66a of the first metal plate 66. As seen from FIG. 12, the first metal plate 66 has a heat receiving portion 70 and a heat exchanging portion 71. The portions 70 and 71 are arranged on the lower surface 66b of the first metal plate 66, side by side along the long axis X1 of the radiation panel 64.

The heat receiving portion 70 has a heat receiving surface 72 and a seat 73. The seat 73 projects downward from the heat receiving surface 72 for a short distance. The seat 73 has a flat seat surface 73a. The seat surface 73a opposes the opening 58 of the main body 54 of the case 45. Four bosses 74 are provided on the heat receiving surface 72 and arranged around the seat 73. The bosses 74 protrude downward from the heat receiving surface 72. The bosses 74 are vertically aligned with the recesses 56 made in the corners of the main body 54. Each of the bosses 74 has a screw hole 75. The screw holes 75 of the bosses 74 are axially aligned with the through holes 57 made in the recess 56, respectively, and open at the upper surface 66b of the first metal plate 66.

The heat exchanging portion 71 has a flat guide surface 77. The guide surface 77 is continuous to the heat receiving surface 72 of the heat receiving portion 70. The heat receiving portion 70 and the heat exchanging portion 71 are located in the same plane.

As shown in FIGS. 5 and 11, the second metal plate 67 is arranged on the upper surface 66b of the first metal plate 66. The plate 67 extends over the heat receiving portion 70 and the heat exchanging portion 71. The second metal plate 67 has shape and thickness, which are determined by the amount of heat the IC chip 51 generates while operating.

The second metal plate 67 has three supports 82a to 82c, which extend outward over the first metal plate 66. The first support 82a and the second support 82b are arranged beside the heat receiving portion 70 of the first metal plate 66. The first support 82a extends along the third edge 65c of the radiation panel 64. The second support 82b extends along the first edge 65a of the radiation panel 64. The third support 82c is arranged beside the heat exchanging portion 71 of the first metal plate 66. The third support 82c extends along the third edge 65a of the radiation panel 64 and is adjacent to the second support 82b.

As shown in FIG. 3, the heat receiving portion 70 of the radiation panel 64 lies above the case 45. The bosses 74 of the heat receiving portion 70 penetrate the recesses 56 of the case 45 and contact the upper surface of the wiring substrate 46. As shown in FIG. 11, two screws 83 are inserted into two of the screw holes 75 made in the bosses 74, respectively, from above the radiation panel 64. The two screws 83 pass through the through holes 57 made in the recesses 56 and also through the wiring substrate 46 and are set in screw engagement in the through holes 38 made in the second circuit board 32.

As shown in FIG. 12, screws 84 are inserted from below into two of the through holes 38 of the second circuit board 32, in which no other screws are set. The screws 84 pass through the wiring substrate 46 and also through the through holes 57 made in the recesses 56 and are set in screw holes 75 made in two of the bosses 74. Thus, as shown in FIGS. 3 and 10, the heat sink 61 and the second circuit board 32 are connected, clamping the MPU 43 between them. The MPU 43 is therefore pressed onto the upper surface 35a of the second circuit board 32. The first connector 39 and the second connector 49 remain fitted together. The heat receiving portion 70 of the radiation panel 64 is secured to the MPU 43. The seat surface 73a of the portion 70 opposes the IC chip 51, spaced therefrom by a short distance. The gap between the seat surface 73a and the IC chip 51 is filled with thermally conductive grease 85. The grease 85 can transfer heat between the seat surface 73a and the IC chip 51.

Figure 4:
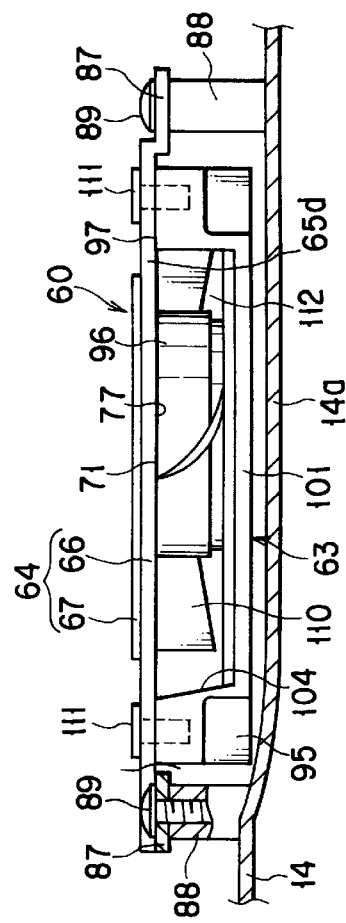
FIG. 4 is a sectional view taken along line 4F—4F in FIG. 5.

As shown in FIG. 10, the heat exchanging portion 71 of the first metal plate 66 projects from a side of the MPU 43 once the radiation panel 64 of the heat sink 61 has been coupled to the case 45 of the MPU 43. The radiation panel 64 has a plurality of brackets 87, which project from the sides of the MPU 43 and the sides of the heat receiving portion 70. As shown in FIG. 4, the brackets 87 is secured, by screws 89, to seats 88 protruding upwards from the bottom wall 14a of the housing 14. The heat sink 61 is thereby arranged, extending parallel to the bottom wall 14a. The guide surface 77 of the heat exchanging portion 71 faces the bottom wall 14a. The second metal plate 67 lies near or contacts the reinforcing plate 21 of the keyboard 18.

The heat pipe 62 has a pipe body 91 filled with an operating medium such as water or alcohol. The pipe body 91 consists of two parts 92a and 92b. The first part 92a extends along the third edge 65c of the radiation panel 64. The second part 92b extends along the first edge 65a of the radiation panel 64. Namely, the pipe body 91 looks L-shaped as viewed from above.

Figure 8:
FIG. 8 is a schematic plan view, representing the positional relation of the heat sink, MPU, fan device and heat pipe which are incorporated in the portable computer.

The first part 92a of the pipe body 91 is fixed to the first support 82a of the second metal plate 67 by means of caulking. The first part 92a is thereby thermally connected to the heat receiving portion 70 of the radiation panel 64. The second part 92b of the pipe body 91 is fixed to the first and second supports 82a and 82b of the second metal plate 67, by means of caulking. The second part 92b is thereby thermally connected respectively to the heat receiving portion 70 and heat exchanging portion 71 of the radiation panel 64. The heat pipe 62 thermally connects the heat receiving portion 70 and the heat exchanging portion 71, because the first and second parts 92a and 92b of the pipe body 91 extend two adjoining sides of the heat sink 61, respectively, as is illustrated in FIG. 8.

The first, second and third supports 82a, 82b and 82c of the second metal plate 67 are bent, wrapping around the pipe body 91. The supports 82a, 82b and 82c are set in reliable contact with the pipe body 91. This minimizes the thermal resistance between the pipe body 91 and each support of the second metal plate 67.

Figure 13:
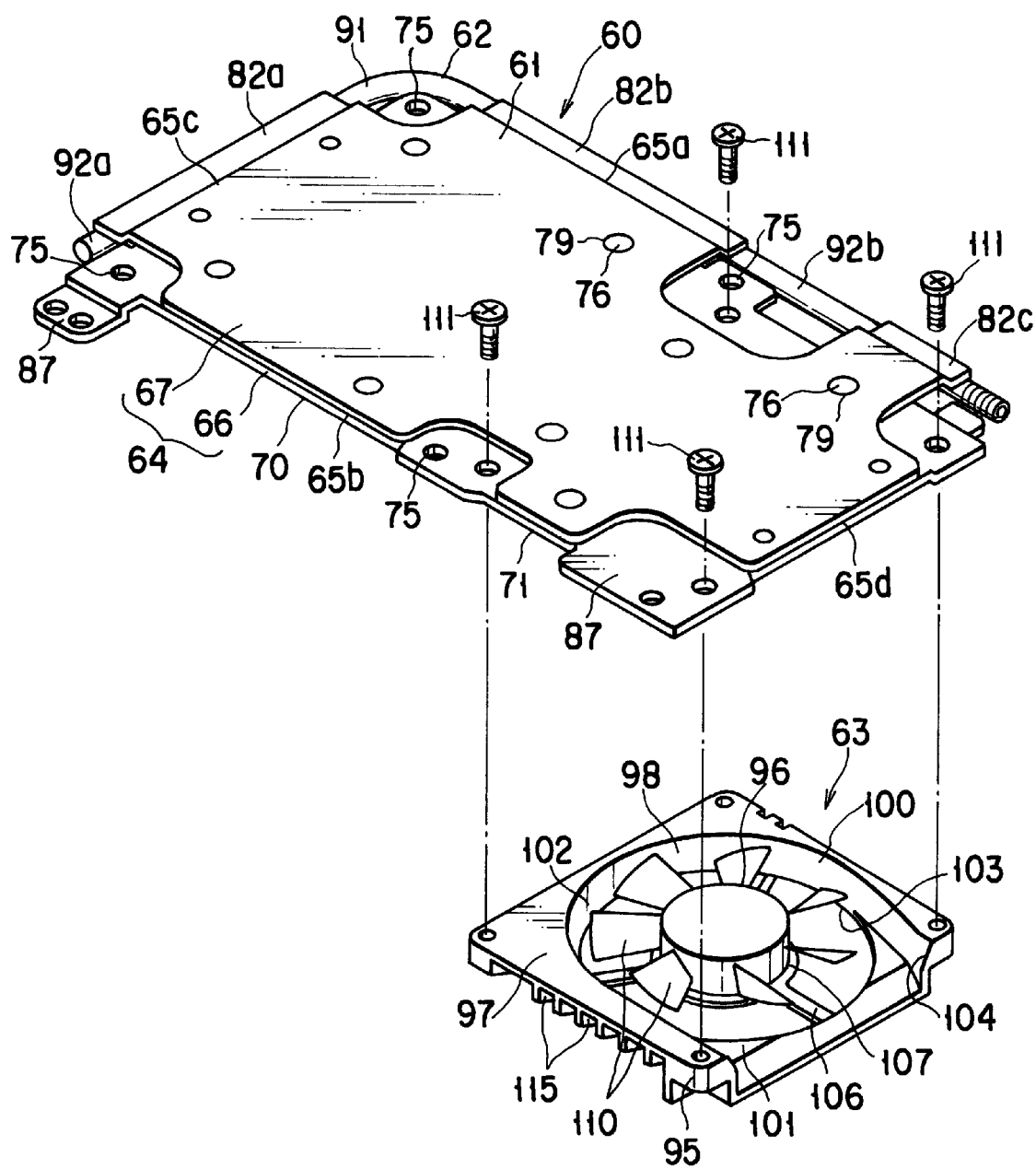
FIG. 13 is an exploded view showing the positional relation of the heat sink and the fan device.

As shown in FIGS. 12 and 13, the fan device 63 is supported on the guide surface 77 of the heat exchanging portion 71. The fan device 63 comprises a fan casing 95 and a fan 96 provided in the fan casing 95.

The fan casing 95 is made of metal having high thermal conductivity, such as aluminum alloy. The fan casing 95 is a flat rectangular frame that has four corners. The fan casing 95 has almost the same thickness as the case 45 of the MPU 43. The casing 95 has a flat support surface 97 that overlaps the guide surface 77 of the heat exchanging portion 71. A fan receptacle 98 is made in the center part of the support surface 97.

The fan receptacle 98 has an opening 100, a bottom wall 101, and a circular wall 102. The opening 100 is almost as large as the support surface 97 of the fan casing 95. The opening 100 exposes the bottom wall 101. The circular wall 102 connects the bottom wall 101 to the support surface 97.

The bottom wall 101 has a circular air inlet port 103, which is axially aligned with the opening 100. The circular wall 102 has an air outlet port 104 in one side of the receptacle 98. Hence, the axis of the air outlet port 104 extends at right angles to the axis of the air inlet port 103.

A motor support 107 is provided in the air inlet port 103 in axial alignment therewith. The support 107 is secured to the bottom wall 101 by a plurality of stays 106, which extend in radial direction of the air inlet port 103. The motor support 107 supports a flat, brush-less DC motor 108 (FIG. 3). The motor 108 has a shaft 109, which is coaxial with the air inlet port 103 and extends in the direction of thickness of the fan casing 95. The motor 108 is electrically connected to the second circuit board 32 by lead lines (not shown). The motor 108 is turned on when the temperature of the MPU 43 reaches a predetermined value.

The fan 96 is connected to the shaft 109 of the motor 108. The fan 96 has a plurality of blades 110. The tips of the blades 110 are close to the circular wall 102 of the fan receptacle 98. The opening 100 and the air inlet port 103 are aligned with the axis O1 of the fan 96. The air outlet port 104 of the fan casing 95 is located away from the axis O1 of the fan 96.

As shown in FIG. 13, the fan casing 95 is fastened to the heat exchanging portion 71 of the radiation panel 64, at its four corners, by means of screws 111. The support surface 97 of the fan casing 95 is thereby set in contact with the guide surface 77 of the heat exchanging portion 71. The guide surface 77 closes the opening 100 of the fan receptacle 98. The guide surface 77 of the radiation panel 64 therefore opposes the fan 96, defining an air passage 112 jointly with the bottom wall 101 and circular wall 102 of the fan receptacle 98. The air passage 112 communicates with the air inlet port 103 and the air outlet port 104.

The fan casing 95 has a number of radiation fins 115. The fins 115 are arranged in the air inlet port 103.

As shown in FIG. 3, the fan device 63 is secured to the heat exchanging portion 71, assuming a horizontal position so that the axis O1 of the fan 96 intersects at right angles with the guide surface 77 of the radiation panel 64. Thus, the fan device 63 extends along the heat exchanging portion 71 of the radiation panel 64. The plain in which the air inlet port 103 exists is spaced from the bottom wall 14a by a short distance. In the space 36 in the housing 14, the air inlet port 103 is located at the right-side part of the second circuit board 32. Therefore, the fan device 63 and the MPU 43 are arranged side by side. The MPU 43 is provided in a space that extends vertically for a distance equal to or shorter than the thickness of the fan device 63.

The air outlet port 104 of the fan casing 95 opens to the fourth edge 65d of the radiation panel 64 and faces away from the MPU 43. The port 104 is adjacent to the right side wall 14d of the housing 14. The side wall 14d has an exhaust port 116, which communicates with the air outlet port 104. Hence, the exhaust port 116 connects the air passage 112 made in the fan device 63, to the atmosphere.

When the portable computer 11 is used, the IC chip 51 of the MPU 43 generates heat. The heat is transmitted to the seat 73 of the radiation panel 64 through the grease 85, and hence to the heat receiving portion 70. The heat is conducted from the portion 70 to the heat exchanging portion 71. From the portion 71 the heat diffuses into the radiation panel 64.

The heat pipe 62 connects the heat receiving portion 71 and heat exchanging portion 72 of the radiation 64. Part of the heat transmitted from the IC chip 51 to the heat receiving part 70 is therefore conducted to the first part 92a of the heat pipe 62 through the first and second supports 82a and 82b. The operating medium in the pipe body 91 is heated, turning into vapor. The vapor flows from the first part 92a to the second part 92b.

The second part 92b of the heat pipe 62 is located far from the MPU 43. The second part 92b remains at a lower temperature and a lower internal pressure than the first part 92a. The vapor in the second part 92b is therefore cooled and condensed into liquid in the first part 92b of the heat pipe 62. The liquid is supplied from the second part 92b into the first part 92a and heated in the first part 92a by the heat applied from the heat receiving portion 70. Thus, the operating medium is repeatedly evaporated and condensed. The heat is thereby transferred efficiently from the heat receiving portion 70 to the heat exchanging portion 71.

When the temperature of the MPU 43 reaches the predetermined value, the brush-less DC motor 108 starts driving the fan 96. The fan 96 forces air from the housing 14 into the air passage 112 through the air inlet port 103. The air flows through the passage 112 toward the air outlet port 104, effectively cooling the fan casing 95 and the radiation panel 64. The heat conducted to the heat exchanging portion 71 is thereby radiated. The air, or cooling air, is expelled from the fan casing 95 through the air outlet port 104 and finally from the housing 14 through the exhaust port 116.

The opening 100 of the fan casing 95 is axially aligned with the air inlet port 103 and is closed by the guide surface 77 of the radiation panel 64. The guide surface 77 defines the air passage 112, jointly with the fan casing 95. Therefore, the cooling air flowing through the air passage 112 is applied directly to the guide surface 77. This means that no thermal resistance exists between the radiation panel 64 and the fan casing 95. Transfer of heat between the panel 64 and the casing 95 is not prevented at all. The heat exchanging portion 71 is thereby efficiently cooled with forced convection of the cooling air. As a result, the heat conducted from the IC chip 51 to the heat exchanging portion 71 is radiated from the panel 64 with high efficiency.

As mentioned above, the fan casing 95 is secured to the heat exchanging portion 71 and made of metal having high thermal conductivity. Heat is efficiently conducted from the heat exchanging portion 71 to the fan casing 95. The fan casing 95 can therefore serve as a part of the heat sink 61.

In addition, the heat conducted from the IC chip 51 to the heat sink 61 efficiently diffuses from the seats 88 to the bottom wall 14a and hence to the other parts of the housing 14. The heat is released from the housing 14 into the atmosphere. Namely, natural air-cooling is accomplished. This is because the first metal plate 66 of the radiation panel 64 is fastened to the seats 88 by the screws 89 as is shown in FIG. 4.

In the portable computer 11, the heat generated by the IC chip 51 is efficiently transferred from the heat receiving portion 70 of the radiation panel 64 to the heat exchanging portion 71 thereof. The heat is eventually expelled into the atmosphere by virtue of convection of the cooling air in the housing 14. The MPU 43 can therefore be cooled sufficiently, without providing many radiation fins on the heat sink 61. The MPU 43 can therefore perform all functions at normal operating temperature.

Moreover, the fan device 63 is secured to the heat exchanging portion 71, assuming a horizontal position so that the axis O1 of the fan 96 intersects at right angles with the guide surface 77. The height of the fan device 63, which protrudes upward from the radiation panel 64, can therefore be small. Further, the fan device 63 is arranged beside the MPU 43. Hence, the cooling unit 60 can be compact and thin. The housing 14 can therefore be thin, while maintaining the high efficiency of radiating heat from the MPU 43.

As indicated above, the radiation panel 64 of the heat sink 61 comprises the first metal plate 66 having the heat receiving portion 70 and heat exchanging portion 71, and a second metal plate 67 laid on the upper surface 66*b* of the first metal plate 66. The second metal plate 67 extends over both the heat receiving portion 70 and the heat exchanging portion 71. The second metal plate 67 has a thermal conductivity α2 that is higher than the thermal conductivity α1 of the first metal plate 66. The plate 67 therefore effectively conducts the heat generated by the IC chip 51 and transferred to the heat receiving portion 70 of the first metal plate 66, to the heat exchanging portion 71. Further, the heat diffuses in the first metal plate 66 to every edge thereof. Thus, the heat sink 61 can conduct heat with high efficiency though it is relatively thin.

To conduct heat efficiently through only the first metal plate 66 made of aluminum alloy, the first metal plate 66 must be thicker to have a larger thermal capacity and a lower thermal resistance. The thicker first metal plate 66, the heavier it is. Hence, the thicker the first metal plate 66, the thicker and heavier the cooling unit 60. To have higher thermal conductivity, the first metal plate 66 may be made of copper-based alloy, which has a higher thermal conductivity than aluminum alloy. However, copper-based alloy has larger specific gravity than aluminum alloy. The cooling unit 60 cannot be made sufficiently light if the first metal plate 66 is made of copper-based alloy.

In the present invention, the second metal plate 67 conducts the heat generated by the IC chip 51 and transferred to the heat receiving portion 70 of the first metal plate 66, to the heat exchanging portion 71. Therefore, the heat can be efficiently transferred from the heat receiving portion 70 to the heat exchanging portion 71, without the necessity of making the first metal plate 66 thicker. As a result, the radiation panel 64 can be as thin and light as is desired.

Moreover, the second metal plate 67 supports the heat pipe 62 in the cooling unit 60. Thus, various types of metal plates are prepared, each different in size and shape or in size and position of the supports 82*a* to 82*c*. One type that can best transfer the heat generated by the IC chip 51 may then be selected and used as the second metal plate 67. In this case, heat will be transferred from the heat receiving portion 70 to the heat exchanging portion 71, neither too much nor too little. The heat sink 61 can be easily modified to conduct heat at the same rate as the CI chip 51 generates heat.

The second metal plate 67 supports the heat pipe 62 in the cooling unit 60. In view of this, various types of metal plates may be prepared, each different in size and shape or in size, and various types of heat pipes may be prepared, each different in diameter and shape. And one type of a metal plate and one type of a heat pipe, that can best transfer the heat generated by the MPU 43, may then be selected and used as the second metal plate 67 and the heat pipe 62, respectively. In this case, heat will be transferred from the MPU 43 at the same rate the MPU 43 generates heat.

As indicated by two-dotted, dashed lines in FIG. 12, a plurality of radiation fins 120 may be arranged at intervals, in the air outlet port 104 of the fan casing 95. Alternatively, as indicated by two-dotted, dashed lines in FIG. 3, a plurality of radiation fins 121 may be provided on the heat exchanging portion 71 of the heat sink 61, in the vicinity of the air outlet port 104 of the fan casing 95. In the first case (FIG. 12), the fan casing 95 contacts the cooling air over a larger area. In the second case (FIG. 3), the heat exchanging portion 71 contacts the cooling air over a larger area. Thus, in either case, the cooling unit 60 acquires higher cooling efficiency without increasing the thickness of the radiation panel 64.

The present invention is not limited to the first embodiment described above. The second embodiment of the invention will be described, with reference to FIGS. 14 to 16.

The second embodiment is different from the first embodiment, only in the shape of the heat pipe 62 provided in the cooling unit 60. Therefore, the components similar or identical to those of the first embodiment are therefore designated at the same reference numerals and will not be described in detail.

Figure 14:
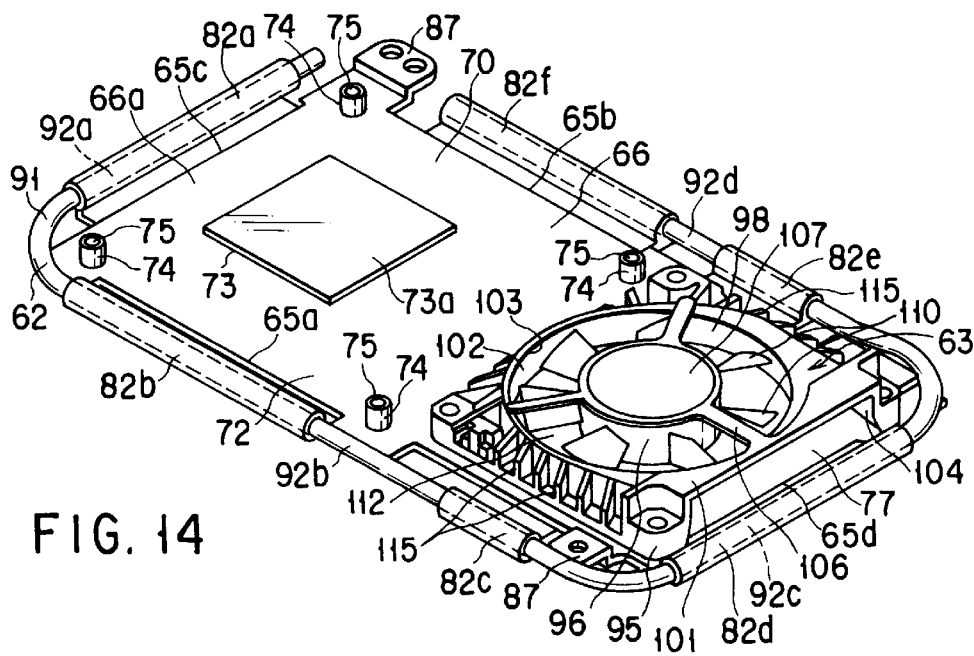
FIG. 14 is a perspective view of the cooling unit according to the second embodiment of the invention.
Figure 15:
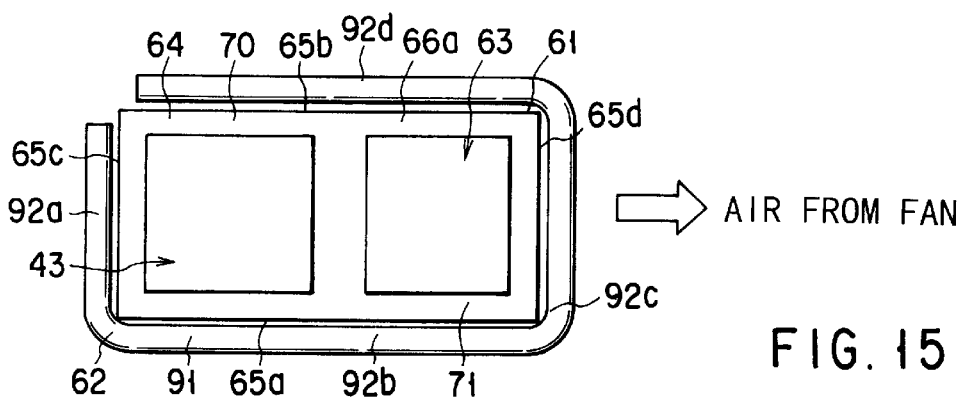
FIG. 15 is a plan view representing the positional relation of the heat sink, MPU, fan device and heat pipe of the second embodiment.

As shown in FIGS. 14 and 15, the heat pipe 62 consists of four parts 92*a*, 92*b*, 92*c* and 92*d*. The first and second parts 92*a* and 92*b* are arranged in the same way as in the first embodiment. The third part 92*c* is connected to the second part 92*b* and extends along the fourth edge 65*d* of the radiation panel 64. The fourth part 92*d* is connected to the third part 92*c* and extends along the second edge 65*b* of the radiation panel 64.

The second metal plate 67 of the radiation panel 64 has six supports 82*a* to 82*f*. The supports 82*a*, 82*b* and 82*c* are arranged in the same way as in the first embodiment. The fourth support 82*d* extends along the fourth edge 65*d* of the panel 64. The fifth support 82*e* extends along the second edge 65*b* of the panel. The fourth and fifth supports 82*d* and 82*e* are arranged at two adjoining sides of the heat exchanging portion 71 of the first metal plate 66. The sixth support 82*f* extends along the second edge 65*b* of the radiation panel 64. The sixth support 82*f* extends along the second edge 65*b* of the panel 64, too, and located adjacent to the heat receiving portion 70 of the first metal plate 66.

The third part 92*c* of the heat pipe 62 is secured to the fourth support 82*d* of the second metal plate 67 by means of caulking. The third part 92*c* is thus thermally connected to the heat exchanging portion 71 by the fourth support 82*d* of the second metal plate 67. The fourth part 92*d* of the heat pipe 62 is secured to the fifth and sixth supports 82*e* and 82*f* of the second metal plate 67 by means of caulking. The fourth part 92*d* is thermally connected to the heat exchanging portion 71 by the fifth support 82*e*, also to the heat receiving portion 70 by the sixth support 82*f*. As is schematically shown in FIG. 15, the heat pipe 62 surrounds the heat receiving portion 70 and the heat exchanging portion 71.

Figure 16:
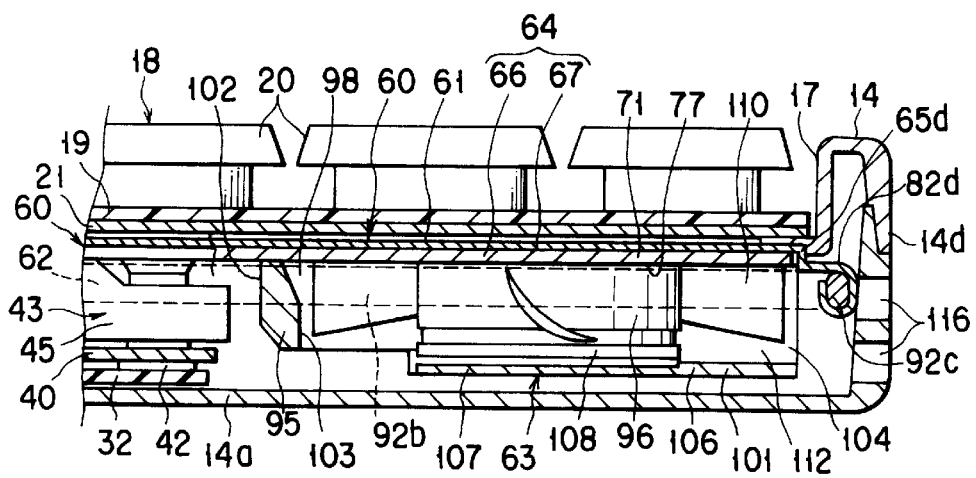
FIG. 16 is a sectional view of the portable computer according to the second embodiment, illustrating the positional relation of the heat pipe, the air outlet port of the fan device, and the exhaust port of the housing.

As shown in FIG. 16, the third part 92*c* of the heat pipe 62 and the fourth support 82*d* of the second metal plate 67 are located between the exhaust port 116 of the housing 14 and the air outlet port 104 of the fan casing 95. The third part 92*c* of the heat pipe 62 and the fourth support 82*d* of the second metal plate 67 exist on the passage of the cooling air exhausted through the port 104 of the fan casing 85. The air therefore directly cools both the third part 92*c* and the fourth support 82*d*.

In the second embodiment, the cooling air exhausted from the fan device 63 is applied directly to the third part 92*c* of the heat pipe 62. The third part 92*c* can be efficiently cooled by virtue of the forced convection of cooling air. The temperature of the third part 92*c* more falls than the temperatures of the first, second and fourth parts 92*a*, 92*b* and 92*d*. Heat is therefore released at high rate from the operating medium that has been vaporized by the heat generated by the IC chip 51.

Hence, heat can be transferred from the heat receiving portion 70 to the heat exchanging portion 71 with high efficiency. Thus, the cooling unit 60 has higher cooling efficiency than in the first embodiment.

Figure 17:
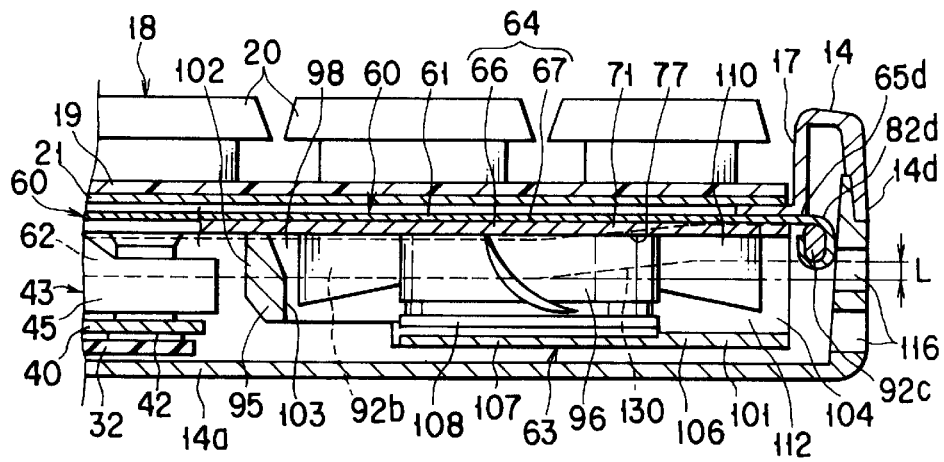
FIG. 17 is a sectional view of a portable computer according to the third embodiment, showing the positional relation of the heat pipe, the air outlet port of the fan device, and the exhaust port of the housing.

FIG. 17 shows the third embodiment of the present invention. The third embodiment is a modification of the second embodiment.

As shown in FIG. 17, the second part 92b of the heat pipe 62 has an end portion 130 that slopes upwards. This end portion 130 is connected to the third part 92c of the heat pipe 62. Although not shown in FIG. 17, the fourth part 92d, which extends parallel to the second part 92b, also has an end portion sloping upwards and connected to the third part 92c. Connected to the sloping end portions of the second and fourth parts 92b and 92d, the third part 92c lies higher by distance L than the second and fourth parts 92b and 92d. As a result, only the lower edge of the third part 92c exists between the air outlet port 104 of the fan casing 95 and the exhaust port 116 of the housing 14. In other words, the heat pipe 62 bulges only a little into the exhaust passage of cooling air.

Not lying in the exhaust passage of cooling air, the third part 92c of the heat pipe 62 does not prevent the cooling air from smoothly flowing from the fan device 63. That is, the resistance to the flow of cooling air is low. The cooling air flows fast enough to cool efficiently the heat exchanging portion 71 of the radiation panel 64. Since the air smoothly flows from the air outlet port 104 to the exhaust port 116, it makes but a small noise. This helps to reduce the noise the fan device 63 makes while operating.

The heat pipe 62 that surrounds the radiation panel 64 may have shapes other than the shapes it has in the embodiments described above.

Figure 18:
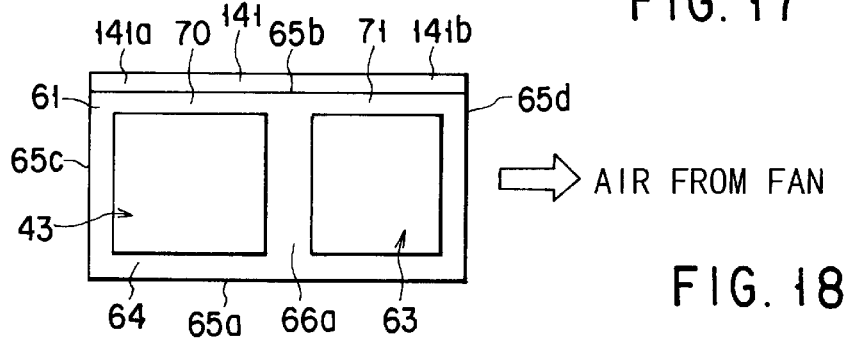
FIG. 18 is a plan view of a portable computer according to the fourth embodiment, depicting the positional relation of the heat sink, MPU, fan device and heat pipe.

FIG. 18 shows the fourth embodiment of the present invention. As shown in FIG. 18, the heat pipe 141 extends straight along only the second edge 65b of the radiation panel 64, or parallel to the long axis X1 of the radiation panel 64. The first half 141a of the heat pipe 141 is thermally connected to the heat receiving portion 70 of the panel 64. The second half 141b of the heat pipe 141 is thermally connected to the heat exchanging portion 71 of the panel 64.

Figure 19:
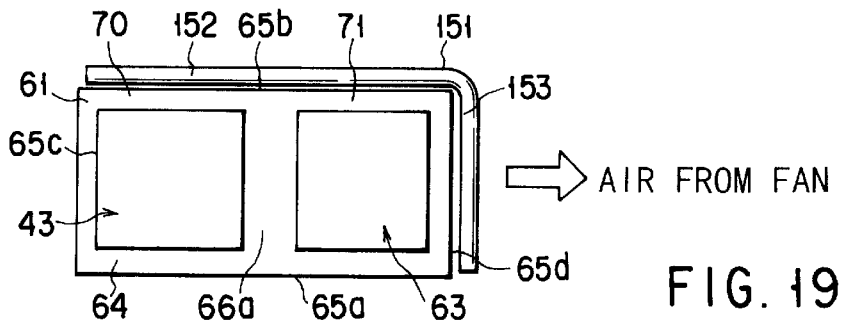
FIG. 19 is a plan view of a portable computer according to the fifth embodiment, depicting the positional relation of the heat sink, MPU, fan device and heat pipe.

FIG. 19 shows the fifth embodiment of the present invention. As illustrated in FIG. 19, the heat pipe 151 consists of two parts 152 and 153. The first part 152 extends along the second edge 65b of the radiation panel 64. The second part 153 extends along the fourth edge 65d of the panel 64. The first part 152 is thermal connected to the heat receiving portion 70 and heat exchanging portion 71 of the panel 64. The second part 153 is thermally connected to the heat exchanging portion 71. The second part 153 crosses the passage through which the cooling air flows after exhausted from the fan device 63.

Figure 20:
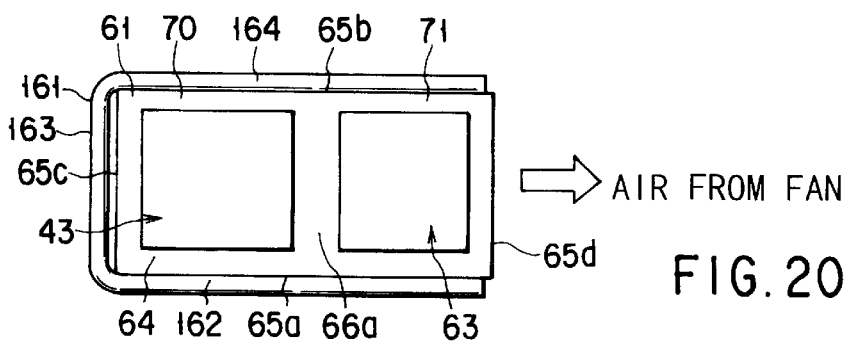
FIG. 20 is a plan view of a portable computer according to the sixth embodiment, depicting the positional relation of the heat sink, MPU, fan device and heat pipe.

FIG. 20 shows the sixth embodiment of the invention. As depicted in FIG. 20, the heat pipe 161 incorporated in the sixth embodiment consists of three parts 162, 163 and 164. The first part 162 extends along the first edge 65a of the radiation panel 64. The second part 163 extends along the third edge 65c of the radiation panel 64. The third part 164 extends along the second edge 65b of the radiation panel 64. The first part 162 and the third part 164 oppose each other, with the heat receiving portion 70 and exchanging portion 71 located between them. They are thermally connected to these portions 70 and 71, respectively. The second part 163 is thermally connected to the heat receiving portion 70.

In the sixth embodiment, the heat pipe 161 surrounds three sides of the heat receiving portion 70, whereby heat is efficiently transmitted from the portion 70 to the heat pipe 161. The heat transmitted to the heat pipe 161 is transferred to the heat exchanging portion 71 through the first and third parts 162 and 164 of the heat pipe 161.

Figure 21:
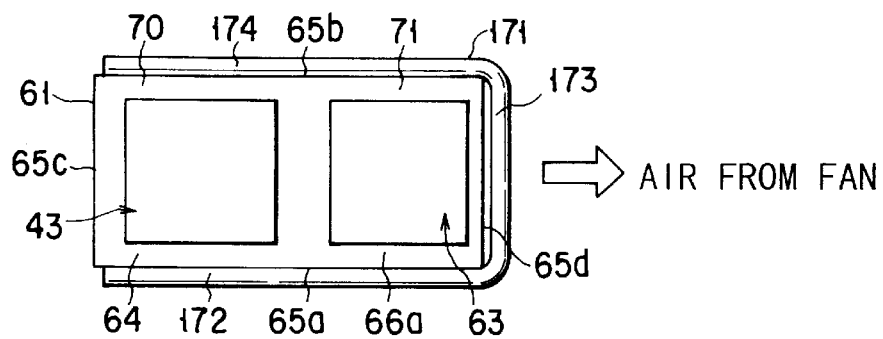
FIG. 21 is a plan view of a portable computer according to the seventh embodiment, depicting the positional relation of the heat sink, MPU, fan device and heat pipe.

FIG. 21 shows the seventh embodiment of the present invention. As illustrated in FIG. 21, the heat pipe 171 used in the seventh embodiment consists of three parts 172, 173 and 174. The first part 172 extends along the first edge 65a of the radiation panel 64. The second part 173 extends along the fourth edge 65d of the radiation panel 64. The third part 174 extends along the second edge 65b of the radiation panel 64. The first part 172 and the third part 174 oppose each other, with the heat receiving portion 70 and exchanging portion 71 located between them. They are thermally connected to these portions 70 and 71, respectively. The second part 173 is thermally connected to the heat exchanging portion 71 and crosses the passage through which the cooling air flows after exhausted from the fan device 63.

In the seventh embodiment, the heat pipe 171 surrounds three sides of the heat exchanging portion 71. The heat transmitted from the heat receiving portion 70 to the heat pipe 171 is transferred to the heat exchanging portion 71 through the first and third parts 172 and 174 of the heat pipe 161.

Figure 22:
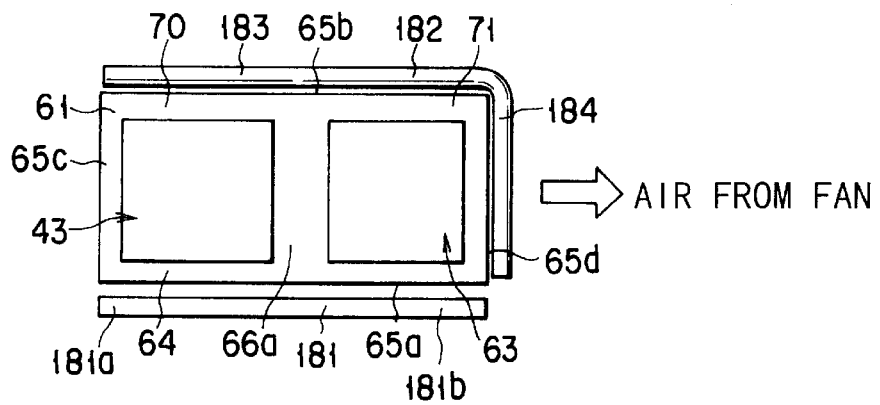
FIG. 22 is a plan view of a portable computer according to the eighth embodiment, depicting the positional relation of the heat sink, MPU, fan device and heat pipe.

FIG. 22 shows the eighth embodiment of this invention. The eighth embodiment is a combination of the fourth and fifth embodiments. In this embodiment, two heat pipes 181 and 182 are provided for one radiation panel 64.

The first heat pipe 181 extends straight along the first edge 65a of the radiation panel 64. Both halves 181a and 181b of the first heat pipe 181 extend parallel to the long axis X1 of the radiation panel 64. The first half 181a is thermally connected to the heat receiving portion 70 of the radiation panel 64. The second half 181b is thermally connected to the heat exchanging portion 71 of the radiation panel 64.

The second heat pipe 182 has two parts 183 and 184. The first part 183 extends along the second edge 65b of the radiation panel 64. The second part 184 extends along the fourth edge 65d of the radiation panel 64. The first part 183 is thermally connected to both the heat receiving portion 70 and the heat exchanging portion 71. The second part 184 is thermally connected to the heat exchanging portion 71. The second part 184 crosses the passage through which the cooling air flows after exhausted from the fan device 63.

In the cooling unit 60 of the eighth embodiment, the heat transmitted from the MPU 43 is transferred to the heat exchanging portion 71 through the first and second heat pipes 181 and 182. Heat can therefore be efficiently transferred from the heat receiving portion 70 to the heat exchanging portion 71. The cooling unit 60 is suitable for cooling the MPU 43, particularly if the MPU 43 is one that generates much heat while operating.

Figure 23:
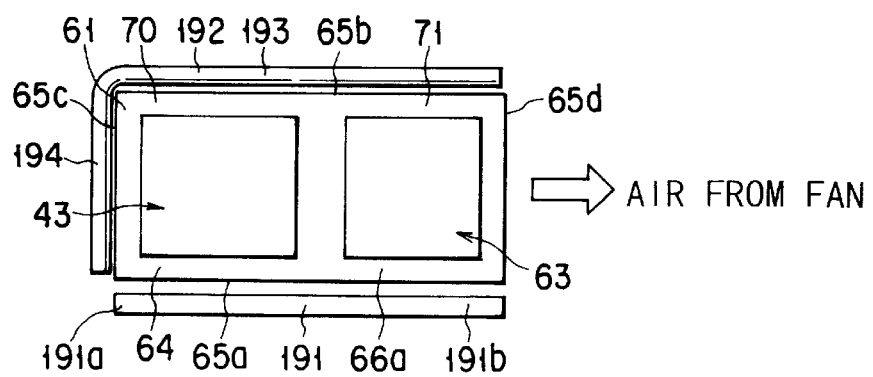
FIG. 23 is a plan view of a portable computer according to the ninth embodiment, depicting the positional relation of the heat sink, MPU, fan device and heat pipe.

FIG. 23 depicts the ninth embodiment of this invention. The ninth embodiment is a combination of the first and fourth embodiments. In the ninth embodiment, two heat pipes 191 and 192 are provided for one radiation panel 64.

The first heat pipe 191 extends straight along the first edge 65a of the radiation panel 64. Both halves 191a and 191b of the first heat pipe 191 extend parallel to the long axis X1 of the radiation panel 64. The first half 191a is thermally connected to the heat receiving portion 70 of the radiation panel 64. The second half 191b is thermally connected to the heat exchanging portion 71 of the radiation panel 64.

The second heat pipe 192 has two parts 193 and 194. The first part 193 extends along the second edge 65b of the radiation panel 64. The first part 193 is thermally connected to both the heat receiving portion 70 and the heat exchanging portion 71. The second part 194 extends along the third edge 65c of the radiation panel 64 and is thermally connected to the heat receiving portion 70.

In the cooling unit 60 of the ninth embodiment, too, part of the heat transmitted from the MPU 43 to the heat receiving portion 70 is transferred to the hat exchanging portion 71 through the first and second heat pipes 191 and 192. Heat can therefore be efficiently transferred from the heat receiving portion 70 to the heat exchanging portion 71.

Figure 24:
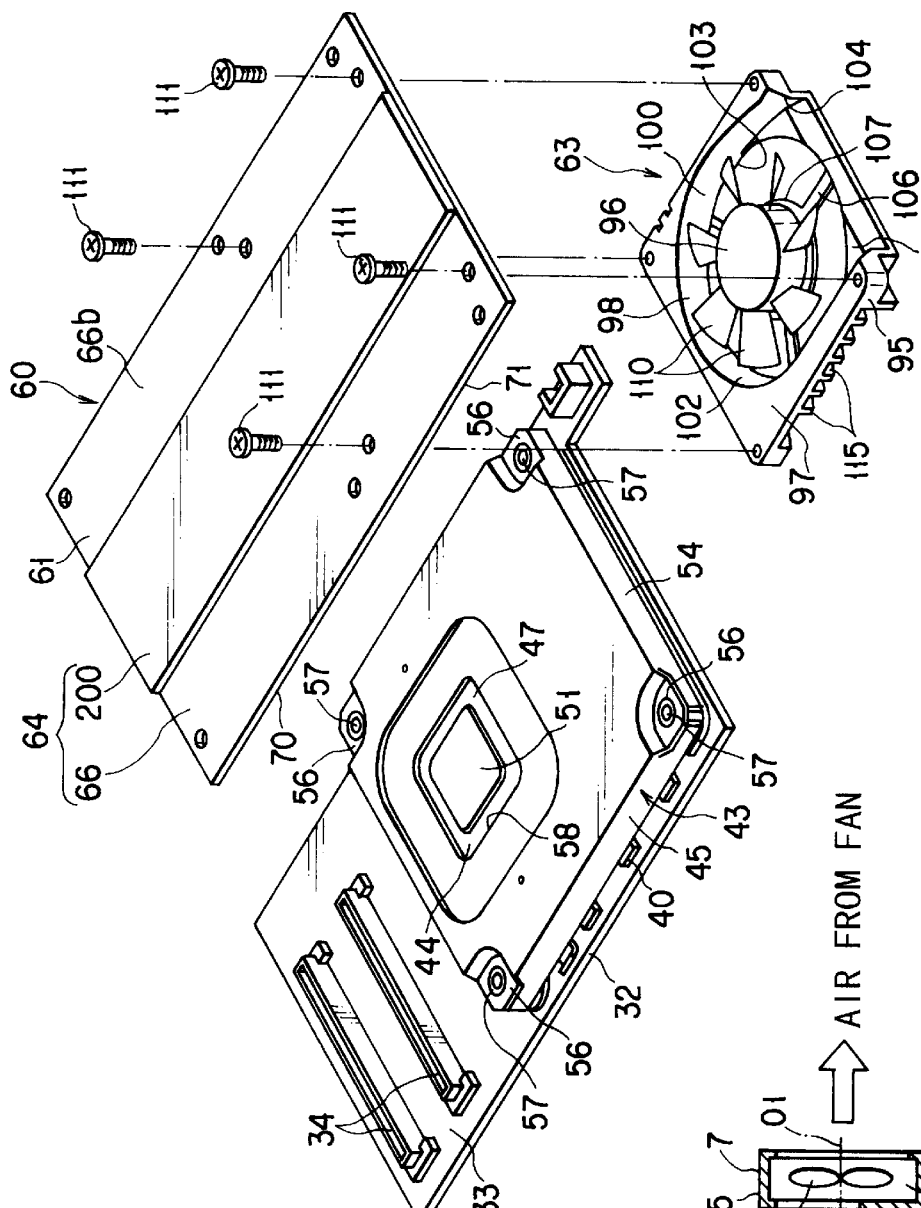
FIG. 24 is a plan view of a portable computer according to the tenth embodiment, depicting the positional relation of the heat sink, MPU, fan device and heat pipe.
Figure 25:
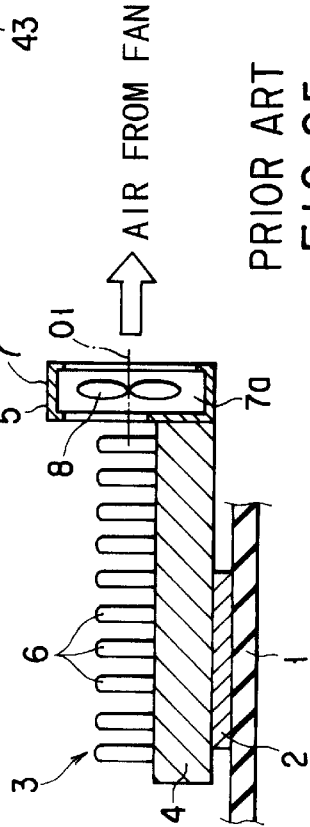
FIG. 25 is a sectional view of a conventional cooling unit.

FIG. 24 shows the tenth embodiment of the present invention. The tenth embodiment is different from the first embodiment in the structure of transferring the heat from the heat receiving portion 70 to the heat exchanging portion 71 of the radiation panel 64.

As shown in FIG. 24, the radiation panel 64 of the heat sink 61 comprises two metal plates 66 and 200. The first metal plate 66 has a heat receiving portion 70 and a heat exchanging portion 71. The second metal plate 200 is fixed to the upper surface 66b of the first metal plate 66. The second metal plate 200 is made of copper alloy. The second metal plate 200 has a thermal conductivity α2 that is higher than the thermal conductivity α1 of the first metal plate 66. The second metal plate 200 is laid on the first metal plate 66 and extends over both the heat receiving portion 70 and the heat exchanging portion 71. Thermally conductive grease (not shown) is applied at the interface between the first metal plate 66 and the second metal plate 200. The thermal resistance at that interface is therefore low.

In the tenth embodiment, the heat generated by the IC chip 51 is transmitted to the heat receiving portion 70 of the first metal plate 66, and hence to the heat exchanging portion 71 thereof. The second metal plate 200, which transfers heat more readily than the first metal plate 66, is laid on the upper surface 66b of the first metal plate 66. Therefore, part of the heat transmitted from the IC chip 51 to the heat receiving portion 70 is conducted from the portion 70 to the heat exchanging portion 71 through the second metal plate 200.

Thus, the second metal plate 200 performs the same function as a heat pipe. The cooling unit 60 used in the tenth embodiment can attain desired cooling efficiency, though the radiation panel 64 does not have radiation fins as in the conventional cooling unit. The cooling unit 60 can therefore be thinner than the conventional one and can be incorporated in the flat housing 14.

In the embodiments described above, the air outlet port of the fan device faces away from the MPU. Instead, the air outlet port may be arranged, facing the MPU. If this is the case, the cooling air exhausted from the fan device is applied onto the MPU.

In the first embodiment, the fan device is arranged, taking a horizontal position so that the axis of the fan intersects at right angles with the guide surface of the heat exchanging portion of radiation panel. Instead, the fan device may be inclined to the guide surface of the heat exchanging portion, provided that the housing is sufficiently thick.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   a housing;
   a heat-generating component in the housing; and
   a heat sink including a first metal plate and a second metal plate, for cooling the heat-generating component, said first metal plate having a heat receiving portion thermally connected to the heat-generating component, and said second metal plate being laid on the first metal plate and thermally connected thereto, and having higher thermal conductivity than said first metal plate.

2. An apparatus according to claim 1, wherein one of the first and second metal plates has a plurality of projections and the other of the first and second metal plates has a plurality of holes, and the projections are fitted in the holes and pressed at tips, whereby the first and second metal plates are coupled to each other.

3. An apparatus according to claim 1, wherein the second metal plate has a higher thermal conductivity than the first metal plates.

4. An apparatus according to claim 1, wherein the first metal plate has a heat exchanging portion formed integral with the heat receiving portion, and the heat receiving portion and the heat exchanging portion are arranged side by side in the housing.

5. An apparatus according to claim 4, wherein the first metal plate is a die-cast molding.

6. An apparatus according to claim 4, further comprising a fan device arranged at the heat exchanging portion, said fan device has a fan that is rotated to apply cooling air to the heat exchanging portion.

7. An apparatus according to claim 6, further comprising a heat pipe supported by the second metal plate, for transferring heat generated by the heat-generating component, from the heat receiving portion to the heat exchanging portion.

8. An apparatus according to claim 7, wherein the heat pipe has a first part thermally connected to the heat receiving portion and a second part thermally connected to the heat exchanging portion, and the second metal plate has a plurality of supports supporting at least the first and second parts of the heat pipe.

9. An electronic apparatus comprising:
   a housing;
   a heat-generating component provided in the housing;
   a heat sink provided in the housing, for cooling the heat-generating component, said heat sink having a first metal plate and a second metal plate, said first metal plate having a heat receiving portion thermally connected to the heat-generating component and a heat exchanging portion formed integral with the heat receiving portion, and said second metal plate being laid on the first metal plate and thermally connecting the heat receiving portion and the heat exchanging portion and having a higher thermal conductivity than the first metal plate;
   a fan device arranged at the heat exchanging portion and including a fan facing the heat exchanging portion, for applying cooling air to the heat exchanging portion; and
   a heat pipe supported by the second metal plate, for transferring heat generated by the heat-generating component, from the heat receiving portion to the heat exchanging portion.

\* \* \* \* \*